United States Patent
Honda

(10) Patent No.: US 8,248,169 B2
(45) Date of Patent: Aug. 21, 2012

(54) SEMICONDUCTOR INTEGRATED CIRCUIT AND ABNORMAL OSCILLATION DETECTION METHOD FOR SEMICONDUCTOR INTEGRATED CIRCUIT

(75) Inventor: Masanori Honda, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 161 days.

(21) Appl. No.: 12/923,164

(22) Filed: Sep. 7, 2010

(65) Prior Publication Data
US 2011/0057735 A1 Mar. 10, 2011

(30) Foreign Application Priority Data
Sep. 8, 2009 (JP) .................................. 2009-206878

(51) Int. Cl.
*G06F 1/04* (2006.01)
(52) U.S. Cl. ............ 331/44; 331/55; 702/78; 324/76.48
(58) Field of Classification Search .................... 331/44, 331/55; 324/76.48; 702/78
See application file for complete search history.

(56) References Cited

U.S. PATENT DOCUMENTS

| 7,529,961 | B2 | 5/2009 | Kondou | |
|---|---|---|---|---|
| 8,055,931 | B2 * | 11/2011 | Ludewig et al. | 713/500 |
| 2006/0149983 | A1 | 7/2006 | Kondou | |
| 2009/0066428 | A1 * | 3/2009 | Badets | 331/49 |

FOREIGN PATENT DOCUMENTS

| JP | 2002-041178 | 2/2002 |
|---|---|---|
| JP | 2006-172202 | 6/2006 |

* cited by examiner

*Primary Examiner* — James E Goodley
(74) *Attorney, Agent, or Firm* — McGinn IP Law Group, PLLC

(57) ABSTRACT

The semiconductor integrated circuit includes a first oscillator, a second oscillator (PLL), a third oscillator (ring oscillator), a selector that switches, in turn, based on a clock of the third oscillator, and outputs a clock of the first oscillator or a clock of the second oscillator, and a determination circuit that counts up or counts down the clock output from the selector, based on the clock of the third oscillator, determines the correspondence of the clock output from the selector and the clock of the third oscillator, based on a result of the counting up or the counting down, and determines whether either of the clock output from the selector or the clock of the third oscillator occur an abnormal oscillation.

6 Claims, 5 Drawing Sheets

SEMICONDUCTOR INTEGRATED CIRCUIT AND ABNORMAL OSCILLATION DETECTION METHOD FOR SEMICONDUCTOR INTEGRATED CIRCUIT

INCORPORATION BY REFERENCE

This application is based upon and claims the benefit of priority from Japanese patent application No. 2009-206878, filed on Sep. 8, 2009, the disclosure of which is incorporated herein in its entirety by reference.

BACKGROUND

1. Field of the Invention

The present invention relates to a semiconductor integrated circuit and an abnormal oscillation detection method for the semiconductor integrated circuit. In particular, the present invention relates to a clock monitor technique of a semiconductor integrated circuit with plural clocks.

2. Description of Related Art

In recent years, there is advanced speed-up of a semiconductor integrated circuit along with making to a highly-functionalization and a highly performance of a system. For it achieves a speed-up of the semiconductor integrated circuit at low power consumption and low price, an oscillator is a conventional composition. For example, a semiconductor integrated circuit according to Japanese Unexamined Patent Application Publication No. 2006-172202 equips with a PLL (Phase Locked Loop) multiplying a clock of the oscillator, and uses a clock of the PLL as an operation clock of a microcomputer.

FIG. 5 is a block diagram showing a semiconductor integrated circuit according to Japanese Unexamined Patent Application Publication No. 2006-172202. The semiconductor integrated circuit 100 includes an oscillator 201, a PLL 301, an abnormal oscillation detection unit 401, a flash ROM (Read Only Memory) 501, a CPU (Central Processing Unit) 601, and plural peripheral devices (701-1-701-n: n is a natural number). The abnormal oscillation detection unit 401 includes an internal reset signal generation circuit 801 (reset generator), and a clock monitor 901. The internal reset signal generation circuit 801 includes a signal generation unit 104.

The oscillator 201 receives a first oscillator output signal supplied from a first oscillator input terminal 101 and a second oscillator input signal supplied from a second oscillator input terminal 102, and outputs a clock signal 21 (an oscillator output signal). The oscillator output signal 21 output from the oscillator 201 is supplied to each the PLL 301 and the clock monitor 901. The PLL 301 receives the oscillator output signal 21, generates a PLL output signal 231, and outputs the PLL output signal 231 to the CPU 601. The clock monitor 901 generates an abnormal oscillation detection signal 241 based on the oscillator output signal 21 and a clock (ring oscillator output signal) 221 supplied from the flash ROM 501, and outputs the abnormal oscillation detection signal 241 to the internal reset signal generation circuit 801. The internal reset signal generation circuit 801 generates an internal reset signal 251 based on a reset signal 271 supplied from a terminal reset signal input terminal 103 and the abnormal oscillation detection signal 241 supplied from the clock monitor 901 and outputs the internal reset signal 251 to the CPU 601.

Therefore, when it occurs an abnormal oscillation of the oscillator output signal 21 supplied from the oscillator 201, it can stop appropriately an operation of the semiconductor integrated circuit 100, corresponding the abnormality. In this case, the semiconductor integrated circuit 100 measures a clock frequency of the oscillator output signal 21 with the ring oscillator output signal 221 supplied from the flash ROM 501, at the clock monitor 901. The semiconductor integrated circuit 100 monitors the operation of the oscillator 201 by comparing the measured clock frequency with a comparison value provided beforehand. The comparison value indicates a frequency of a predetermined range (guaranteed operating range). For example, when the semiconductor integrated circuit 100 is designed to operate in corresponding the oscillator output signal 21 of a range of 5 MHz to 7 MHz, the abnormal oscillation detection unit 401 generates the abnormal oscillation detection signal 241 when it detects a frequency (for examples, a frequency of 8 MHz) out of the comparison value. Therefore, when a signal including a high-frequency content (for example, the above-mentioned frequency content of 8 MHz) exceeded a clock frequency at normal times is output from the oscillator 201, the semiconductor integrated circuit 100 determines that the high-frequency content is an abnormal oscillation, and stops operations of the CPU 601 and the peripheral device (701-1-701-n).

Further, a semiconductor integrated circuit according to Japanese Unexamined Patent Application Publication No. 2002-41178 divides a PLL output signal with a frequency divider, and determines whether it occurs an abnormal oscillation in PLL output signal with a divider clock frequency and input clock.

SUMMARY

The semiconductor integrated circuit 100 according to Japanese Unexamined Patent Application Publication No. 2006-172202 is a composition detecting an abnormal oscillation by the clock monitor 901. However, the semiconductor integrated circuit 100 might not be able to detect an abnormal oscillation of a clock. That is, the semiconductor integrated circuit 100 can not detect an abnormal oscillation of the oscillator output signal 21, when it occurs an abnormal oscillation of the ring oscillator output signal 221.

It is because that the semiconductor integrated circuit 100 assumes the ring oscillator output signal 221 supplied from the flash ROM 501 as a sampling clock, and measures the oscillator output signal 21 at the clock monitor 901. Therefore, when it occurs an abnormal oscillation of the ring oscillator output signal 221, or when the output of the ring oscillator output signal 221 stops, it does not normally measure the oscillator output signal 21 at the clock monitor 901, and can not generate the abnormal oscillation detection signal 241.

Additionally, the clock monitor 901 has only a function to measure the oscillator output signal 21. Therefore, the semiconductor integrated circuit 100 can not detect an abnormal oscillation of the ring oscillator output signal 221 and the PLL output signal 231.

It is because that the ring oscillator output signal 221 has only a role as a sampling clock to measure the oscillator output signal 21. Therefore, there is no clock and function to monitor the ring oscillator output signal 221 own. Further, the semiconductor integrated circuit 100 has no means to measure the PLL output signal 231 to detect an abnormal oscillation of the PLL output signal 231.

The semiconductor integrated circuit according to Japanese Unexamined Patent Application Publication No. 2002-41178 is a composition detecting an abnormal oscillation of a PLL output signal, however, can not detect an abnormal oscillation of a ring oscillator output signal.

The present invention is a semiconductor integrated circuit including: a first oscillator, a second oscillator, a third oscillator, a selector, and a determination circuit. The selector switches, in turn, based on a clock of the third oscillator, and outputs a clock of the first oscillator or a clock of the second oscillator. The determination circuit counts up or counts down the clock output from the selector, based on the clock of the third oscillator, determines the correspondence of the clock output from the selector and the clock of the third oscillator, based on a result of the counting up or the counting down, and determines whether either of the clock output from the selector or the clock of the third oscillator occurs an abnormal oscillation. Therefore, the semiconductor integrated circuit can determine whether either of the clock of the first oscillator, the clock of the second oscillator, or the clock of the third oscillator occurs an abnormal oscillation.

The present invention is an abnormal oscillation detection method for semiconductor integrated circuit. The method includes: switching, in turn, based on a clock of the third oscillator and outputting a clock of the first oscillator or a clock of the second oscillator; counting up or counting down the clock of the first oscillator or the clock of the second oscillator, based on the clock of the third oscillator; determining the correspondence of the clock of the first oscillator or the clock of the second oscillator and the clock of the third oscillator, based on a result of the counting up or the counting down. Therefore, the semiconductor integrated circuit can determine whether either of the clock of the first oscillator, the clock of the second oscillator, or the clock of the third oscillator occurs an abnormal oscillation.

According to the present invention, it is possible to provide that a semiconductor integrated circuit and an abnormal oscillation detection method for the semiconductor integrated circuit can determine whether either of the oscillator output signal, the PLL output signal, or the ring oscillator output signal occur an abnormal oscillation.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Hereinafter, specific embodiments to which a semiconductor integrated circuit and an abnormal oscillation detection method for the semiconductor integrated circuit according to the present invention will be described. Note that, the present invention is not limited to following-described exemplary embodiments. Further, following descriptions and drawings arbitrarily simplify to illustrate specifically.

First Exemplary Embodiment

Figure 1:
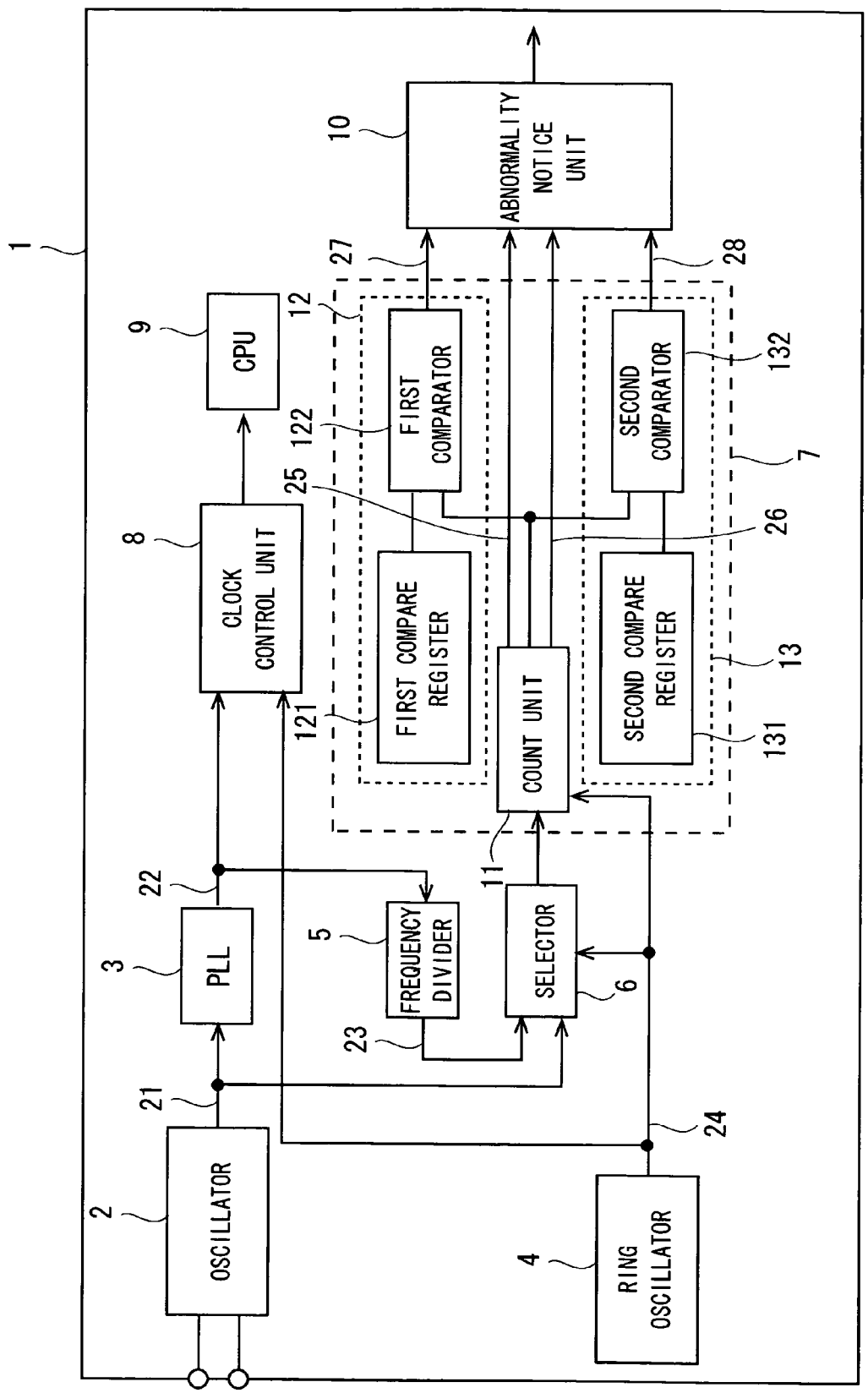
FIG. 1 is a block diagram schematically showing a semiconductor integrated circuit according to a first exemplary embodiment of the present invention.

FIG. 1 shows a block diagram of a semiconductor integrated circuit 1 according to a first exemplary embodiment of the present invention.

The semiconductor integrated circuit 1 includes an oscillator 2 which is a first oscillator, a PLL 3 which is a second oscillator, a ring oscillator 4 which is a third oscillator, a frequency divider 5, a selector 6, and a determination circuit 7. Further, the semiconductor integrated circuit 1 includes a clock control unit 8, a CPU 9, and an abnormality notice unit 10. That is, the semiconductor integrated circuit 1 includes the oscillator 2, the PLL 3 multiplying an oscillator output signal 21, and the ring oscillator 4. The clock control unit 8 selects a PLL output signal 22 and a ring oscillator output signal 24 as an operation clock, and outputs the selected signal to the CPU 9, on the semiconductor integrated circuit 1. Further, the frequency divider 5 divides the PLL output signal 22, based on a multiple rate of the PLL 3.

The selector 6 receives the oscillator output signal 21, a frequency divider output signal 23, and the ring oscillator output signal 24. The selector 6 switches, in turn, based on the ring oscillator output signal 24, and outputs the oscillator output signal 21 or the frequency divider output signal 23 to the determination circuit 7.

The determination circuit 7 counts up or counts down the clock output from the selector 6, based on the ring oscillator output signal 24. Further, the determination circuit 7 determines the correspondence of the clock output from the selector 6 and the ring oscillator output signal 24, based on a result of the counting up or the counting down, and detects an abnormal oscillation of either of the oscillator output signal 21, the PLL output signal 22, or the ring oscillator output signal 24. The abnormal oscillation, in this case, shows a stop, a high-speed oscillation, and a low-speed oscillation of a clock frequency.

that is, the determination circuit 7 includes a count unit 11, a first determination unit 12, and a second determination unit 13. The count unit 11 receives a clock from the selector 6. For example, The count unit 11 counts up the oscillator output signal 21, which is one clock selected by the selector 6, as a clock to count. Otherwise, the count unit 11 counts down the frequency divider output signal 23, which is the other clock selected by the selector 6, as the clock to count. The count unit 11 switches either of a counting up operation or a counting down operation, based on a leading edge of the ring oscillator output signal 24. Otherwise, the count unit 11 might be a composition switching either a counting up operation or a counting down operation, based on a trailing edge of the ring oscillator output signal 24.

In the count unit 11, a value at the starting the counting up operation is set to "0" (first parameter). Further, in the count unit 11, a value at the switching from a counting up operation to a counting down operation is set to the oscillator output signal 21 (second parameter) for one cycle of the ring oscillator output signal 24 at normal time. Furthermore, in the count unit 11, a value at the finishing the counting down operation is set to "0" (third parameter). Therefore, when the semiconductor integrated circuit 1 operates normally, the oscillator output signal 21 and the frequency divider output signal 23 dividing a multiple rate of the PLL 3 are same frequency. That is, when the oscillator output signal 21, the PLL output signal 22 and the ring oscillator output signal 24 are normal, a counter value of which the oscillator output signal 21 is the clock to count and a counter value of which the frequency divider output signal 23 is the clock to count are same value.

Figure 2:
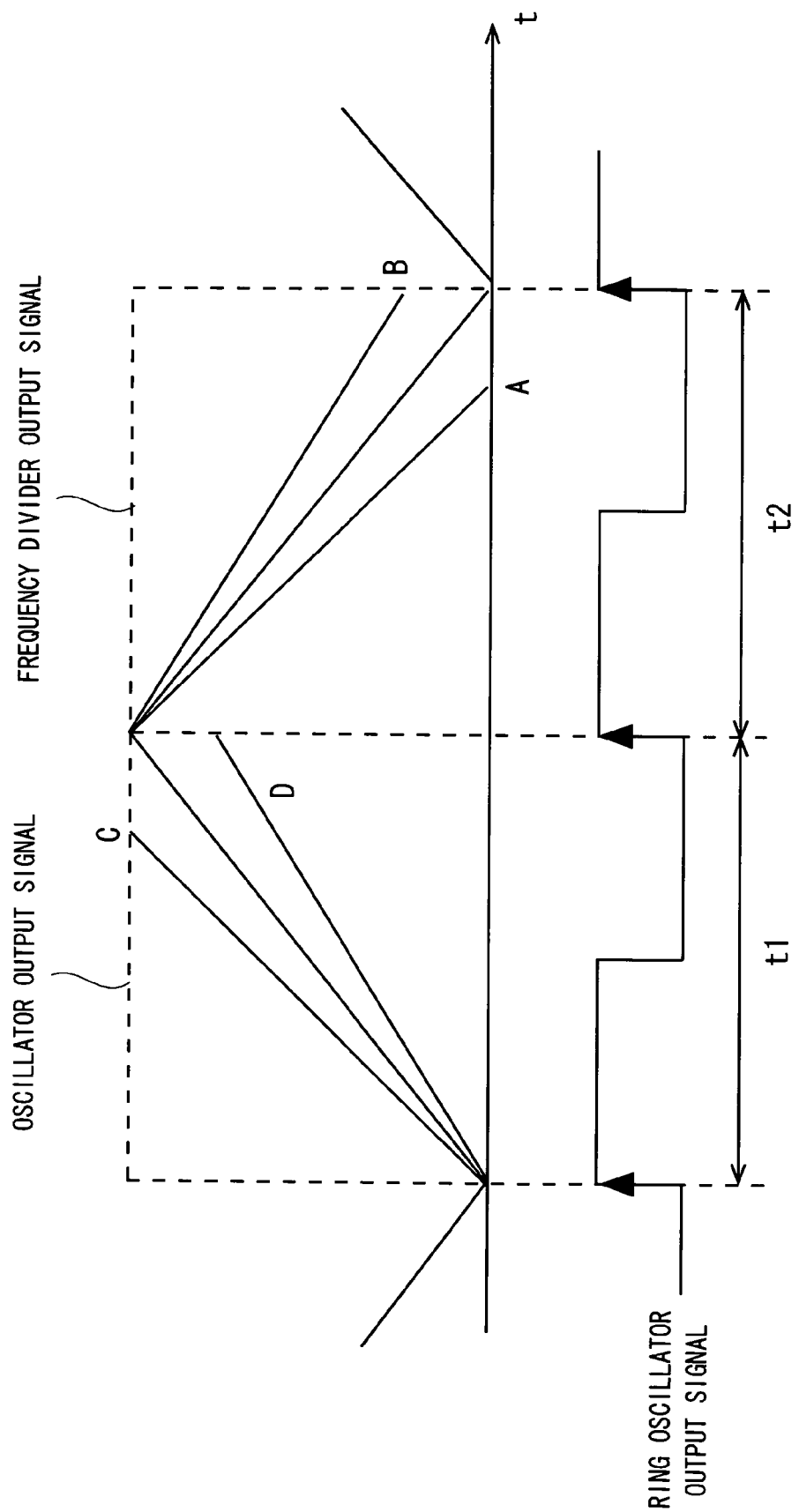
FIG. 2 is a timing diagram detecting an abnormal oscillation in a semiconductor integrated circuit according to a first exemplary embodiment of the present invention.

In particular, at FIG. 2, it is assumed that t1 is a period which the count unit 11 counts the oscillator output signal 21 as a clock to count, and that t2 is a period which the count unit 11 counts the frequency divider output signal 23 as a clock to count. In this case, it consists that t1 is equals to t2, because each t1 and t2 corresponds to one cycle of the ring oscillator output signal 24. Therefore, when the count unit 11 counts up the oscillator output signal 21 as a clock to count under the t1 period and then the count unit 11 counts down the frequency divider output signal 23 as a clock to count under the t2 period, the counter value of the count unit 11 returns to "0". Accordingly, the determination circuit 7 can determine that the oscillator output signal 21, the PLL output signal 22, and the ring oscillator output signal 24 are normal.

On the other hand, when it occurs a high-speed abnormal oscillation of the oscillator output signal 21, or it occurs a low-speed abnormal oscillation of the ring oscillator output signal 24, the counter value overflows the second parameter, when the count unit 11 counts up the oscillator output signal 21 (C in FIG. 2). Therefore, the count unit 11 generates an overflow signal 25 at the overflow, and outputs the overflow signal 25 to the abnormality notice unit 10. Accordingly, the determination circuit 7 can determine that it occurs an abnormal oscillation of the oscillator output signal 21 or the ring oscillator output signal 24. Note that, when it occurs an abnormal oscillation of the oscillator output signal 21, it inevitably occurs an abnormal oscillation of the PLL output signal 22, too.

Moreover, when it occurs a high-speed abnormal oscillation of the frequency divider output signal 23, or it occurs a low-speed abnormal oscillation of the ring oscillator output signal 24, the counter value underflows the third parameter, when the count unit 11 counts down the frequency divider output signal 23 (A in FIG. 2). Therefore, the count unit 11 generates an underflow signal 26 at the underflow, and outputs the underflow signal 26 to the abnormality notice unit 10. Accordingly, the determination circuit 7 can determine that it occurs an abnormal oscillation of the PLL output signal 22 or the ring oscillator output signal 24.

the first determination unit 12 includes a first compare register 121 and a first comparator 122. The first compare register 121 outputs a first threshold value provided beforehand, to the first comparator 122. For example, the first threshold value is set the above-mentioned second parameter. Either, the first threshold value is not always provided the second parameter, may be provided a lower limit to be able to be considered the counter value to be counted up as an abnormal oscillation. The first comparator 122 compares the first threshold value to be input and the counter value at the switching from a counting up operation to a counting down operation. When the counter value is under the first threshold value, the first comparator 122 generates an abnormal oscillation signal 27, and outputs the abnormal oscillation signal 27 to the abnormality notice unit 10. In this case, if the counter value is under the first threshold value, it shows a state of D in FIG. 2. Therefore, the determination circuit 7 can determine that it occurs a low-speed abnormal oscillation of the oscillator output signal 21, or it occurs a high-speed abnormal oscillation of the ring oscillator output signal 24. Note that, when it occurs a low-speed abnormal oscillation of the oscillator output signal 21, it inevitably occurs a low-speed abnormal oscillation of the PLL output signal 22, too.

the second determination unit 13 includes a second compare register 131 and a second comparator 132. The second compare register 131 outputs a second threshold value provided beforehand, to the second comparator 132. For example, the second threshold value is provided the above-mentioned third parameter. Either, the second threshold value is not always provided the third parameter, may be provided an upper limit to be able to be considered the counter value to be counted down as an abnormal oscillation. The second comparator 132 compares the second threshold value to be input and the counter value at the switching from a counting down operation to a counting up operation. When the counter value is over the second threshold value, the second comparator 132 generates an abnormal oscillation signal 28, and outputs the abnormal oscillation signal 28 to the abnormality notice unit 10. In this case, if the counter value is over the second threshold value, it shows a state of B in FIG. 2. Therefore, the determination circuit 7 can determine that it occurs a low-speed abnormal oscillation of the frequency divider output signal 23, or it occurs a high-speed abnormal oscillation of the ring oscillator output signal 24.

The abnormality notice unit 10 generates a signal noticing that it occurs an abnormal oscillation, based on a signal supplied from the determination circuit 7, and outputs the signal to be generated to, for example, the CPU 9.

the semiconductor integrated circuit 1 and the abnormal oscillation detection method for the semiconductor integrated circuit counts up the oscillator output signal 21 and counts down the frequency divider output signal 23, based on the ring oscillator output signal 24. That is, the semiconductor integrated circuit 1 and the abnormal oscillation detection method for the semiconductor integrated circuit can lead a relative relation (correspondence) between the ring oscillator output signal 24 and the oscillator output signal 21, by counting the oscillator output signal 21 for one cycle of the ring oscillator output signal 24. On the other hand, the semiconductor integrated circuit 1 and the abnormal oscillation detection method for the semiconductor integrated circuit can lead a relative relation (correspondence) between the ring oscillator output signal 24 and the frequency divider output signal 23, by counting the frequency divider output signal 23 for one cycle of the ring oscillator output signal 24. Therefore, the semiconductor integrated circuit 1 and the abnormal oscillation detection method for the semiconductor integrated circuit can determine whether either of the oscillator output signal 21, the PLL output signal 22, or the ring oscillator output signal 24 occurs an abnormal oscillation. Furthermore, it is not necessary to add a large circuit compared with a related semiconductor integrated circuit, and it is possible to detect an abnormal oscillation by a circuit, a scale of the circuit is equal to a scale of the related semiconductor integrated circuit.

Second Exemplary Embodiment

Figure 3:
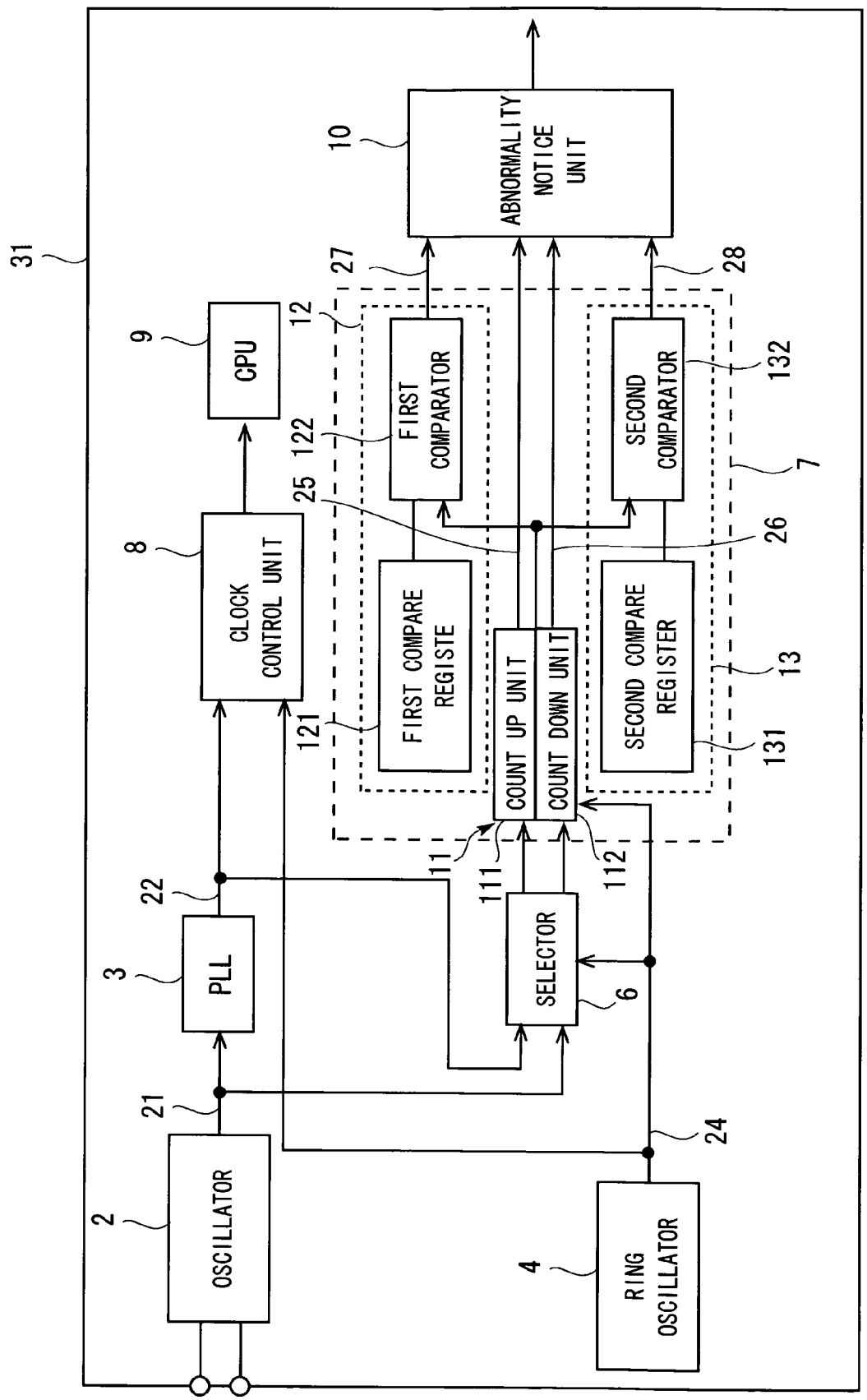
FIG. 3 is a block diagram schematically showing a semiconductor integrated circuit according to a second exemplary embodiment of the present invention.

A semiconductor integrated circuit 31 according to a second exemplary embodiment is a composition in which the count unit 11 is divided into a count up unit 111 and a count down unit 112, showing in FIG. 3. Note that, redundant explanation thereof is omitted as the semiconductor integrated circuit 31 according to a second exemplary embodiment is the semiconductor integrated circuit 1 according to a first exemplary embodiment and same abbreviation compositions.

The count up unit 111 receives the oscillator output signal 21 and the ring oscillator output signal 24. The count up unit 111 counts up the oscillator output signal 21, until the ring oscillator output signal 24 leads edge next. In this case, when it occurs a high-speed abnormal oscillation of the oscillator output signal 21, or it occurs a low-speed abnormal oscillation of the ring oscillator output signal 24, the counter value overflows the second parameter, when the count up unit 111 counts up the oscillator output signal 21. Therefore, the count up unit 111 generates an overflow signal 25 at the overflow, and outputs the overflow signal 25 to the abnormality notice unit 10.

The count down unit 112 receives the PLL output signal 22 and the ring oscillator output signal 24. In this case, a bit wide of the count down unit 112 is set for a bit wide of the count up unit 111 to differ only by the multiple rate of the PLL 3. In the result, the semiconductor integrated circuit 31 can determine whether either of the PLL output signal 22 or the ring oscillator output signal 24 occurs an abnormal oscillation, to similar abbreviation as the count unit 11 according to a first exemplary embodiment. That is, the count down unit 112 counts down the PLL output signal 22, until the ring oscillator output signal 24 leads edge next. In this case, when it occurs high-speed abnormal oscillation of the PLL output signal 22, or it occurs low-speed abnormal oscillation of the ring oscillator output signal 24, the counter value underflows the third parameter, when the first determination unit 12 counts down the PLL output signal 22. There, the count down unit 112 generates an underflow signal 26 at the underflow, and outputs the underflow signal 26 to the abnormality notice unit 10. Therefore, the semiconductor integrated circuit 31 can determine whether either of the PLL output signal 22 or the ring oscillator output signal 24 occurs an abnormal oscillation.

The semiconductor integrated circuit 31 can omit the frequency divider 5. Therefore, it is possible to contribute to the miniaturization of the semiconductor integrated circuit.

Third Exemplary Embodiment

Figure 4:
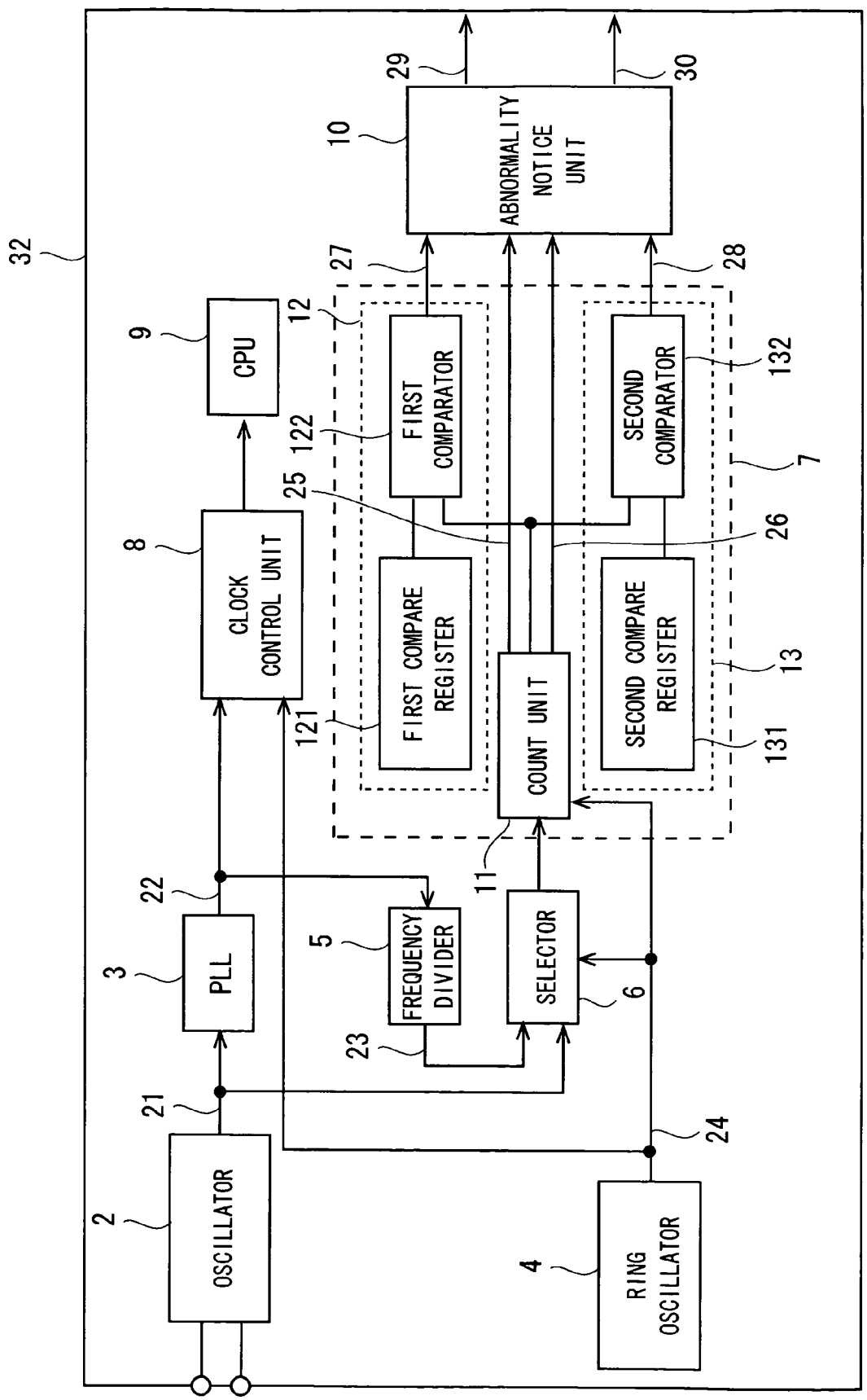
FIG. 4 is a block diagram schemtically showing a semiconductor integrated circuit according to a third exemplary embodiment of the present invention.
Figure 5:
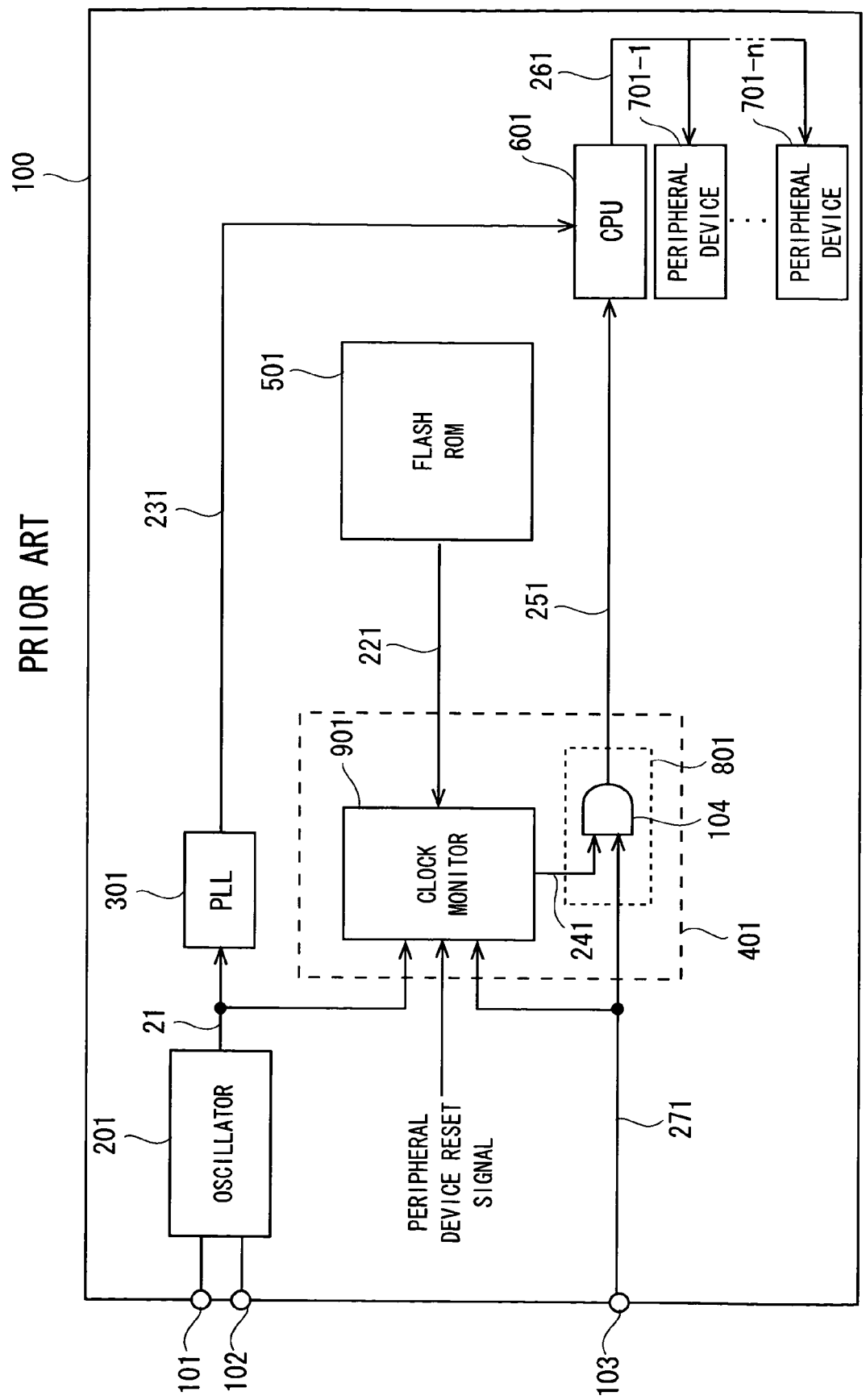
FIG. 5 is a block diagram schematically showing a semiconductor integrated circuit to a related art.

A semiconductor integrated circuit 32 according to a third exemplary embodiment is a composition in which the abnormality notice unit 10 generates a reset signal 29 and an abnormal detection interruption signal 30, showing in FIG. 4. Note that, redundant explanation thereof is omitted as the semiconductor integrated circuit 32 according to a third exemplary embodiment is the semiconductor integrated circuit 1 according to a first exemplary embodiment and same abbreviation compositions.

The abnormality notice unit 10 generates the reset signal 29 and the abnormal detection interruption signal 30, based on the overflow signal 25, the underflow signal 26, the abnormal oscillation signal 27, and the abnormal oscillation signal 28 supplied from the determination circuit 7. For example, when it occurs a high-speed abnormal oscillation of the oscillator output signal 21, there is a possibility to exceed the operation standard of the semiconductor integrated circuit 32. Therefore, the abnormality notice unit 10 immediately generates the reset signal 29, and outputs the reset signal to a reset generator (not shown) at the subsequent stage, for example. The reset generator outputs the reset signal 29 to the CPU 9.

When the abnormality notice unit 10 receives the others signal, the abnormality notice unit 10 generates the abnormal detection interruption signal 30 and outputs the abnormal detection interruption signal 30 to an interruption controller (not shown) at the subsequent stage as follows, for example. The interruption controller outputs the abnormal detection interruption signal 30 to the CPU 9.

The semiconductor integrated circuit 32 generates the reset signal 29 and the abnormal detection interruption signal 30. Therefore, the semiconductor integrated circuit 32 can arbitrarily select a process after it occurs an abnormal oscillation of the clock.

Note that, the present invention is not limited to the above-described exemplary embodiments, and various modifications can be made as appropriate to the exemplary embodiments without departing from the spirit and scope of the present invention. For example, in the above-mentioned exemplary embodiments, the determination circuit counts up the oscillator output signal, and count down the frequency divider output signal (PLL output signal), but even if it is opposite, it is acceptable.

If a specification has more than third exemplary embodiments, add the following.

The first, second, and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a first oscillator;
   a second oscillator;
   a third oscillator;
   a selector that switches, in turn, based on a clock of the third oscillator, and outputs a clock of the first oscillator or a clock of the second oscillator; and
   a determination circuit that counts up or counts down the clock output from the selector, based on the clock of the third oscillator, determines the correspondence of the clock output from the selector and the clock of the third oscillator, based on a result of the counting up or the counting down, and determines whether either of the clock output from the selector or the clock of the third oscillator occur an abnormal oscillation.

2. The semiconductor integrated circuit according to claim 1, wherein
   the determination circuit including:
   a count unit that counts up or counts down the clock received from the selector, based on the clock of the third oscillator, and outputs an overflow signal or an underflow signal, based on a result of the counting up or the counting down,
   a first determination unit that compares a counter value at the switching from a counting up operation to a counting down operation and a first threshold value to be provided beforehand, and outputs an abnormal oscillation signal when the counter value is under the first threshold value, and
   a second determination unit that compares a counter value at the switching from a counting down operation to a counting up operation and a second threshold value to be provided beforehand, and outputs an abnormal oscillation signal when the counter value is over the second threshold value.

3. The semiconductor integrated circuit according to claim 2, wherein
   the count unit including:
   a count up unit that receives the clock of the first oscillator, and
   a count down unit that receives the clock of the second oscillator,
   a bit wide of the count up unit and a bit wide of the count down unit is different from the clock of the first oscillator and the clock of the second oscillator only by multiplication.

4. The semiconductor integrated circuit according to claim 1, further comprising an abnormality notice unit that receives a determination result of the determination circuit, notices that it occurs an abnormal oscillation.

5. The semiconductor integrated circuit according to claim 4, wherein
the abnormality notice unit that generates the reset signal or an abnormal detection interruption signal based on the determination result of the determination circuit.

6. An abnormal oscillation detection method for a semiconductor integrated circuit comprising:
switching, in turn, based on a clock of the third oscillator and outputting a clock of the first oscillator or a clock of the second oscillator,
counting up or counting down the clock of the first oscillator or the clock of the second oscillator, based on the clock of the third oscillator;
determining the correspondence of the clock of the first oscillator or the clock of the second oscillator and the clock of the third oscillator, based on a result of the counting up or the counting down.

* * * * *